(12) United States Patent
Liu et al.

(10) Patent No.: US 7,696,000 B2
(45) Date of Patent: Apr. 13, 2010

(54) LOW DEFECT SI:C LAYER WITH RETROGRADE CARBON PROFILE

(75) Inventors: Yaocheng Liu, Elmsford, NY (US); Subramanian S. Iyer, Mount Kisco, NY (US); Jinghong Li, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 11/565,793

(22) Filed: Dec. 1, 2006

(65) Prior Publication Data

US 2008/0128806 A1   Jun. 5, 2008

(51) Int. Cl.
*H01L 21/00* (2006.01)
(52) U.S. Cl. ......... 438/99; 257/E21.085; 257/E21.154
(58) Field of Classification Search .............. 438/99; 257/E21.054, E21.085, E21.154
See application file for complete search history.

(56) References Cited

U.S. PATENT DOCUMENTS

| 5,360,986 A | 11/1994 | Candelaria |
| 7,169,675 B2 * | 1/2007 | Tan et al. .................... 438/301 |
| 2005/0269561 A1 | 12/2005 | Chidambarrao et al. |

OTHER PUBLICATIONS

W. Skorupa, R.A. Yankov, "Carbon-mediated effects in silicon and in silicon-related materials"; Materials Chemistry and Physics, vol. 44 (1996) pp. 101-144, Elsevier Scences, Jan. 1996.*

A. Nejim and P.L.F. Hemment, "SiC buried layer formation by ion beam synthesis at 950 Celcius", Applied Physics Letters, vol. 66 (20), pp. 2646-2649, May 15, 1995.*

Peng-Shiu Chen and T.E. Hsieh, "Removal of end-of-range defects in Ge+ -pre-amorphized Si by carbon ion implantation", vol. 85, No. 6, pp. 3114-3119, Mar. 15, 1999.*

Strane, J. W., et al., "Carbon incorporation into Si at high concentrations by ion implantation and solid phase epitaxy", J. Appl. Phys. 79 (2), Jan. 1996, pp. 637-646.

Wolf, S., et al., "Silicon Processing for the VLSI Era, vol. 1—Process Technology", 1986, pp. 280-308.

* cited by examiner

*Primary Examiner*—W. David Coleman
(74) *Attorney, Agent, or Firm*—Scully, Scott, Murphy & Presser, P.C.; H. Daniel Schnurmann (57) ABSTRACT

Formation of carbon-substituted single crystal silicon layer is prone to generation of large number of defects especially at high carbon concentration. The present invention provides structures and methods for providing low defect carbon-substituted single crystal silicon layer even for high concentration of carbon in the silicon. According to the present invention, the active retrograde profile in the carbon implantation reduces the defect density in the carbon-substituted single crystal silicon layer obtained after a solid phase epitaxy. This enables the formation of semiconductor structures with compressive stress and low defect density. When applied to semiconductor transistors, the present invention enables N-type field effect transistors with enhanced electron mobility through the tensile stress that is present into the channel.

16 Claims, 4 Drawing Sheets

LOW DEFECT SI:C LAYER WITH RETROGRADE CARBON PROFILE

FIELD OF THE INVENTION

The present invention relates to semiconductor structures and methods of manufacture, and more particularly to a carbon-substituted single crystal silicon layer (Si:C) and a metal-oxide-semiconductor field effect transistor (MOSFET) utilizing such carbon-substituted single crystal silicon layers (Si:C).

BACKGROUND OF THE INVENTION

Various techniques for enhancing semiconductor device performance through manipulation of carrier mobility have been investigated in the semiconductor industry. One of the key elements in this class of technology is the manipulation of stress in the channel of transistor devices. Some of these methods utilize a carbon-substituted single crystal silicon (Si:C) layer within a silicon substrate to change the lattice constant of the silicon material in the channel. While both silicon and carbon have identical electronic outer shells and the same crystal structure, that is, "the diamond structure," their room temperature lattice constants are different with values of 0.5431 nm and 0.357 nm, respectively. By substituting some of the silicon atoms in single crystal silicon with carbon atoms, a single crystal structure with a smaller lattice constant than that of pure silicon may be obtained.

To increase the amount of stress on adjoining semiconductor structures, it is necessary to increase the carbon content. In other words, the higher the carbon content in an Si:C layer, the higher the stress on adjoining structures. Incorporation of carbon into a silicon substrate during the manufacture of silicon substrates is very difficult due to the low equilibrium solubility of carbon ($3.5 \times 10^{17}/cm^3$ or 7 ppm in atomic concentration) at the melting point of silicon. Practically, carbon cannot be incorporated into the silicon substrate during the growth of silicon ingot. However, a higher metastable solubility limit up to $7.0 \times 10^{20}/cm^3$ (1.4% in atomic concentration) was observed during the process of solid phase epitaxy of a carbon implanted silicon layer in bulk silicon wafers according to Strane et al., "Carbon incorporation into Si at high concentrations by ion implantation and solid phase epitaxy," J. Appl. Phys. 79 (2), Jan. 1996, pp. 637-646. In the experiments described in Strane et al., the silicon substrates were first amorphized with a silicon implant and then implanted with carbon atoms. By performing solid phase epitaxy, a carbon-substituted single crystal silicon layer was regrown from the carbon implanted silicon layer. Strane et al., also established that after solid phase epitaxy, the carbon atoms occupy substitutional sites to form an Si:C layer. However, the presence of a band of defects corresponding to the end-of-range defects due to the silicon amorphization implant was also observed as well. Furthermore, at a high carbon concentration of 1.9%, a high level of crystalline defects was observed in the Si:C layer.

Since then, due to the potential benefit of enhancing performance of CMOS transistors, formation of Si:C layers by solid phase epitaxy has been investigated further despite the difficulties of obtaining low defect density Si:C layers. Formation of an Si:C layer with a high carbon concentration between 0.1% and 5%, preferably between 0.5% and 2.0% has been pursued due to the advantageous properties of generating a high level of stress. It has been found that the higher the carbon concentration in the Si:C layer is, the higher the defect density in the resulting Si:C layer. However, a high level of crystalline defect density is detrimental to the CMOS transistor performance since the defects serve as a leakage path for the off-current of the transistor. The defects in the strained single crystal layer also cause stress relief and deleteriously impact the mobility gains from the stress engineering.

A CMOS transistors may be built on a carbon-substituted single crystal silicon layer by utilizing relaxed Si:C layer as a substrate and growing epitaxial silicon on top of it. One method of obtaining an Si:C layer with a smaller lattice constant than that of silicon is to grow a thick Si:C layer with the thickness exceeding the critical thickness for the generation of crystalline defects. An alternative method is to grow an Si:C layer on a silicon-on-insulator (SOI) substrate so that the entire Si:C layer on top of the buried oxide layer has a smaller lattice constant than that of silicon. Silicon may be epitaxially grown on the relaxed Si:C layer so that the lattice constant of the silicon material matches that of the underlying relaxed Si:C. In this case, the epitaxially grown silicon is under a biaxial compressive stress in the plane of epitaxial growth. An N-type field effect transistor (NFET) built in such a substrate has enhanced electron mobility and consequently an increased on-current.

Alternatively, CMOS transistors may be built by embedding Si:C layers in the source and drain regions of a field effect transistor that is built on a silicon substrate. The presence of the embedded Si:C layers in the source and drain creates a uniaxial tensile stress in the channel region along the direction of the movement of carriers. Such stress enhances the mobility of electrons in the transistor. Consequently, an N-channel field effect transistor (NFET) built in such a substrate has enhanced mobility and consequently an enhanced on-current.

Therefore, there exists a need for a semiconductor structure and methods for fabricating a low defect, high carbon concentration Si:C layer.

There exists another need for a semiconductor structure and methods for locally incorporating a low defect, high carbon concentration Si:C layer epitaxially into a field effect transistor.

SUMMARY OF THE INVENTION

To address the needs described above, the present invention provides an epitaxial Si:C layer with a high bulk carbon concentration from about 0.2% to about 5.0% in atomic concentration as well as a low defect density less than about $1.0 \times 10^9/cm^2$ by retrograding the carbon concentration profile near the surface of the silicon substrate. Also, the present invention provides an embedded epitaxial Si:C layer with high bulk carbon concentration and low defect density within the source and drain regions of CMOS transistors. When such epitaxial Si:C layers are embedded into the source and drain of an NFET, the resulting uniaxial tensile stress in the channel of the NFET enhances the electron mobility, enabling a mobility enhanced NFET.

While some retrograding of the carbon concentration can be observed in vertical profiles of the carbon concentration in the prior art, the degree of the retrograding is not severe but minor and occurs naturally as a result of the limitation of the tools used for ion implantation. The "accidental" or "passive" weak retrograding of carbon concentration in the prior art resulted mostly from nonuniformity of the carbon implant profile since most ion implantation is performed with a preset implantation energy, typically within the range from about 2 keV to about 100 keV. Each ion implantation energy setting creates a peak in the "depth profile" of the implanted ions. To minimize the vertical variation of the concentration of implanted species, multiple implantations of the same species with different energy are often used. Even in these cases, the presence of some degree of retrograde in the vertical profile of the concentration of the implanted species is inevitable since no ion implantation apparatus can implant ions with zero energy. A general discourse on ion implantation profiles is found in S. Wolf and R. N. Tauber, "Silicon Processing for the VLSI Era, Vol. 1—Process Technology," (1986) pp. 280-308.

In contrast to the accidental or machine-limited retrograding, the present invention advocates an "active" retrograde profile in the vertical profile of the carbon concentration for the manufacture of a Si:C layer with reduced defect density. Typically, a Si:C layer formed beneath the surface of a silicon substrate through ion implantation has a desired carbon concentration level. This level is from about 0.2% to about 5.0% in atomic concentration for the purposes of stress engineering, and typically, from about 0.5% to about 2.0% in atomic concentration. The prior art approach was to keep the concentration within the Si:C layer constant as much as possible except for a naturally occurring retrograding near the silicon surface and the tails at the deeper end of the implanted area, where the carbon concentration exponentially decreases with depth. This is so since the purpose of the Si:C layer is to provide high carbon concentration. Reducing the carbon concentration anywhere, including the volume near the surface, would reduce the amount of incorporated carbon. However, according to the present invention, the "active" retrograde profile of in the vertical profile of the carbon concentration suppresses the carbon concentration at the surface so that it does not exceed 25% of the carbon concentration in the bulk of the Si:C layer. This is achieved by eliminating the portion of the carbon implant that would deliver any substantial quantity of carbon near the surface, i.e., the low energy settings are eliminated in the carbon implantation. Preferably, the concentration of carbon at the surface does not exceed 15% of the concentration in the bulk of the Si:C layer. Most preferably, the concentration of carbon at the surface is less than about $1.0 \times 10^{20}/cm^3$ or 0.2% in atomic concentration.

While a substantial reduction of carbon concentration near the surface compared to the concentration in the bulk is a fairly simple concept and application of this general idea still produces some benefits even outside the ranges specified in the present invention in terms of reduction in the crystalline defect density, definite criteria are set herein in terms of the method for determining the carbon concentration "in the bulk" and "near the surface" for the sake of a precise description of the present invention and of enabling the practice of this invention for its full benefit. Also, the degree of retrograde in the carbon profile and the level of defect density in the resulting Si:C layer are also quantified to describe and define the present invention.

For the purpose of description of the present invention, a portion of a silicon substrate with implanted carbon within the top layer of the silicon substrate is assumed. It is obvious that by epitaxially depositing silicon on such a structure, a strained silicon layer can be formed and the structure that is described herein may become a part of such a larger structure to realize the benefits of the devices described earlier. Alternatively, if the portion of a silicon substrate is epitaxially embedded with a transistor structure, the neighboring silicon material is subjected to a stress due to the differences in the lattice parameters.

Trace amount of carbon is present in most semiconductor substrates and theoretically speaking, up to the carbon solubility limit of 7 ppm or $3.5 \times 10^{17}$ $cm^3$ of carbon could be incorporated during the silicon ingot growth. Any carbon concentration above that must be introduced into the substrate through carbon implantation or diffusion later on. For this reason, the depth of the silicon material, as measured from the top surface of the silicon substrate, at which the carbon concentration becomes $3.5 \times 10^{17}/cm^3$ is defined as the thickness of the carbon implanted silicon layer if such a depth exists. Since the concentration of carbon decreases exponentially below a certain depth, the thickness of a carbon implanted silicon layer is a well defined dimension in a bulk silicon substrate.

In other semiconductor substrates in which a non-semiconductor layer underlies directly beneath a silicon layer into which carbon is implanted, such as a buried oxide layer of a silicon-on-insulator substrate, the depth of the silicon material at which the carbon concentration becomes $3.5 \times 10^{17}/cm^3$ may or may not be present in the silicon layer. In other words, the projected range of implanted carbon atoms may exceed the thickness of the silicon layer above the non-semiconductor layer in such structures. If the projected range of implanted carbon atoms exceeds the thickness of the silicon layer over the non-semiconductor layer, the thickness of the silicon layer itself is the thickness of the carbon implanted silicon layer. In such a case, none or only part of the exponential decrease in the carbon concentration with depth, that is present in all carbon implanted silicon layers in a bulk silicon substrate, is present in the vertical profile of carbon concentration.

For the purposes of description of the present invention, a first volume of the carbon implanted silicon layer denotes the portion of the carbon implanted silicon layer for which the distance to the top surface of the carbon implanted silicon layer is less than 2% of the thickness of the carbon implanted silicon layer itself. "Surface carbon concentration" according to the present invention denotes the average concentration of carbon within the second volume of the carbon implanted silicon layer. A second volume of a carbon implanted silicon layer denotes the portion of the carbon implanted silicon layer for which the distance to the top surface of the carbon implanted silicon layer is between 30% and 60% of the thickness of the carbon implanted silicon layer itself. Since a peak carbon concentration, or more often, a plateau level carbon concentration is found about the middle of the carbon implanted silicon layer in almost all carbon concentration profiles after a carbon implant, the average carbon concentration in the first volume is representative of the overall level of carbon concentration of the carbon implanted silicon layer and serves as a good indicator of the total amount of carbon in the carbon implanted silicon layer. "Bulk carbon concentration" according to the present invention denotes the average carbon concentration within the first volume of the carbon implanted silicon layer.

A key metric for the quality of the Si:C layer is the defect density in the crystalline structure. In general, a high defect density in the crystalline structure causes leakage paths for electrical current during the off-state of the transistor increasing power consumption of the chip. Also, it provides a stress relief mechanism to reduce the stress in and around the layer as well as serving as a scattering center for the carriers to reduce the carrier mobility. Therefore, it is necessary to limit the defect density in Si:C layers to fabricate a high performance semiconductor circuitry. Defect density of less than about $1.0 \times 10^9/cm^2$ is typically considered acceptable for the fabrication of a high performance semiconductor circuitry. Such a low defect density in Si:C layers have been observed only in the Si:C layers grown by solid phase epitaxy with low carbon concentration of up to about $1.0 \times 10^{20}/cm^3$ according to the prior art. For the purposes of description of the present invention, Si:C layers with a defect density less than about $1.0 \times 10^9/cm^2$ is used as the threshold for differentiating poor quality Si:C layers with relatively high carbon concentrations enabled through the prior art and the high quality Si:C layers that this invention enables at similarly high bulk carbon concentrations.

During the research leading to the present invention, Si:C layers with 2% or higher concentration of carbon have been successfully fabricated through the use of prior art methods including carbon implantation and solid phase epitaxy. However, the presence of a large number of defects including dislocation, stacking faults, and microtwins were observed at the top surface of the Si:C layers thus manufactured. The higher the carbon concentration, the higher the defect density was. The existence of these defects degrades transistor performance through the mechanisms described above.

Conventional theory about the formation of defect generation during a solid phase epitaxy assumes defect nucleation at the growth front. The initial growth surface at the beginning of a solid phase epitaxy is the interface between the underlying crystal silicon and the amorphized material formed by the amorphization implant. Once the defects are nucleated, they extend toward the top surface with the growth surface as the growth surface moves during the solid phase epitaxy. An implication of this theory is that defects are clustered near the end-of-range of the preamorphization implant. Also, according to this theory, carbon implantation into an SOI substrate such that the end-of-range of the preamorphization implant falls within the buried oxide layer should eliminate most of the defects.

However, the research leading to the present invention showed that carbon implantation into an SOI substrate after a preamorphization implant, with the end-of-range depth within the buried oxide layer, did not eliminate most of the defects in high carbon concentration films. Instead, a high concentration of defects near the surface was observed in all high carbon concentration Si:C layers.

From these experiments, it was concluded that the surface carbon concentration is the determinant of the density of defects in the Si:C layer instead of the bulk carbon concentration. By creating an active retrograde profile in the carbon concentration, Si:C layers with a defect density of less than about $1.0 \times 10^9/cm^2$ were consistently produced for bulk carbon concentration of 1%~3% in atomic concentration. Fabrication of Si:C layers with both such high bulk carbon concentration and such low defect density were not possible in any prior art.

Therefore, according to a first embodiment of the present invention, an Si:C layer is formed within a semiconductor substrate by a carbon implantation with an active retrograde profile, followed by a regrowth of the carbon implanted silicon layer into an Si:C layer through a solid phase epitaxy. An active retrograde profile has a surface carbon concentration that is equal to or less than 25% of the bulk carbon concentration. Preferably, the active retrograde profile has a surface carbon concentration that is equal to or less than 15% of the bulk carbon concentration. Most preferably, the active retrograde profile has a surface carbon concentration that is equal to or less than about $1.0 \times 10^{20}/cm^3$ or about 0.2% in atomic concentration. Also, preferably, the concentration of carbon monotonically decreases from the depth at 30% of the thickness of the carbon implanted silicon layer to the depth at 2% of the thickness of the carbon implanted silicon layer as measured from the top surface of the carbon implanted silicon layer.

After the carbon implantation, the carbon implanted silicon layer is converted to a carbon-substituted single crystal silicon (Si:C) through solid phase epitaxy. The carbon atoms that were incorporated into an amorphized silicon structure are placed during the process of the solid phase epitaxy into substitutional sites within a single crystal silicon structure. Multiple methods of solid phase epitaxy are presently available, which include a conventional anneal in a furnace, a rapid thermal anneal, a flash anneal, and a laser anneal. In general, solid phase epitaxy of silicon requires a temperature above 650° C. The length of time required for completion of solid phase epitaxy depends on the temperature and the thickness of the carbon implanted silicon layer but is in general proportional to the thickness of the carbon implanted silicon layer and become shorter with increasing temperature.

The Si:C layer thus regrown is a continuous film that serves as an epitaxial template on which to deposit strained silicon. The deposition of strained silicon is preferably performed by silicon epitaxy. Since the strained silicon has a smaller lattice parameter within the plane of the epitaxial growth, a compressive biaxial stress is present within the layer. Such a strained silicon layer has an enhanced hole mobility that can be used to fabricate a PFET with enhanced on-current. Other semiconductor devices may also take advantage of the biaxial compressive stress on an epitaxially grown silicon film on top of the structure according to the first embodiment of the present invention.

According to a second embodiment of the present invention, at least one Si:C layer is formed within a semiconductor device, preferably within the source and drain regions of a transistor, by a carbon implantation with an active retrograde profile and followed by a regrowth of the carbon implanted silicon layer into an Si:C layer through a solid phase epitaxy. More preferably, the transistor is an NFET transistor. An active retrograde profile has a surface carbon concentration that is equal to or less than 25% of the bulk carbon concentration. Preferably, the active retrograde profile has a surface carbon concentration that is equal to or less than 15% of the bulk carbon concentration. Most preferably, the active retrograde profile has a surface carbon concentration that is equal to or less than about $1.0 \times 10^{20}/cm^3$ or about 0.2% in atomic concentration. Also, preferably, the concentration of carbon monotonically decreases from the depth at 30% of the thickness of the carbon implanted silicon layer to the depth at 2% of the thickness of the carbon implanted silicon layer as measured from the top surface of the carbon implanted silicon layer.

For the reason that the vertical profile of the carbon concentration cannot be well defined around the periphery of and outside the area of the carbon implant where any presence of carbon is due to lateral straggle of the implanted carbon atoms, all parameters pertaining to the quantification of the Si:C layer are measured within the area of the carbon implant.

The same methods for solid phase epitaxy may be employed for the purposes of the second embodiment of the present invention including a conventional anneal in a furnace, a rapid thermal anneal, a flash anneal, and a laser anneal. The process conditions are also identical.

Preferably, the Si:C layer thus regrown is embedded within the source and drain regions of a transistor. In such a transistor, the body of the transistor comprises a silicon crystal. Some electrical doping with extension and halo implants may also be present. However, a substantial portion, if not all, of each of the source and drain comprises an Si:C layer, with structural limitations for the Si:C layer according to the second embodiment of the present invention. Since the source and drain regions of such transistors have a smaller lattice constant than that of an unstressed silicon crystal, the source and drain regions exert a uniaxial tensile stress on the channel of the transistor in the direction of the current flow. This results in the increase in the electron mobility in the channel. Thus, an NFET with a higher on-current due to the enhanced electron mobility is constructed according to the second embodiment of the present invention.

DETAILED DESCRIPTION OF THE INVENTION

Before describing the present invention in detail, a discussion on the limitation of the prior art in terms of the capability to fabricate a high carbon concentration Si:C is presented. The purpose of this discussion is to clearly delineate the newly enabled features of the present invention against the limitations in the prior art.

Figure 7:
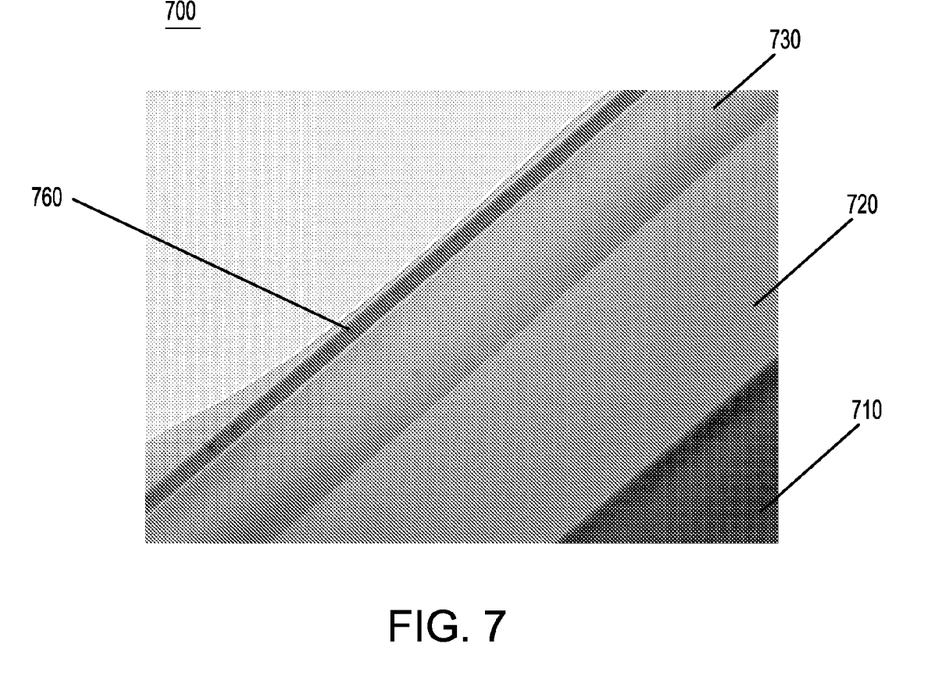
FIG. 7 shows a second transmission electron micrograph 700 of a Si:C layer with an active retrograde profile according to the first embodiment of the present invention.

Conventional carbon implantation for the manufacture of an Si:C layer typically utilizes carbon implants with one or multiple implant energy settings. The resulting depth profile of the carbon involves a small degree of retrograde near the surface as shown in FIG. 7 in Strane, et al. The spike in the carbon concentration near the surface in FIG. 7 of Strane et al., is artificial and is most likely to be an artifact of secondary ion mass spectroscopy (SIMS) near the surface of the sample. In FIG. 7 of Strane et al., it is noteworthy that the carbon concentration of about 0.4% near the surface of the film is about 67% of the peak carbon concentration of 0.6%. Obviously, the carbon concentration of such a film near the surface is greater than 25% of the of the peak carbon concentration, let alone the bulk carbon concentration defined above which takes an average over a distance range.

Figure 1:
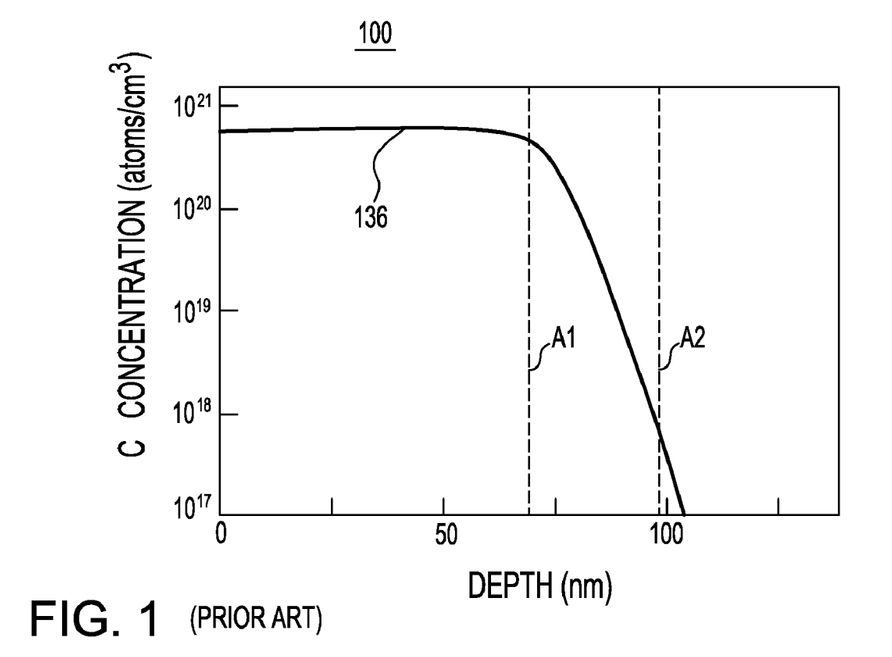
FIG. 1 shows a first graph 100 of a first depth profile 136 of carbon concentration of an Si:C layer according to the prior art.

An example of a depth profile 136 of carbon concentration according to the prior art with a weak retrograding as can be seen in Strane et al., is shown in a first graph 100 in FIG. 1. Since the vertical axis of the first graph 100 in FIG. 1 has a logarithmic scale, only a gentle slope is seen in the depth profile 136 near the surface. Most of the prior art methods, in their effort to increase the stress of the Si:C layer, incorporates as much carbon as possible, creating a similar depth profile for carbon concentration. The exponential decrease in the carbon concentration beyond a first depth A1 is also seen in the first graph 100. A second depth A2 that marks the thickness of the carbon implanted silicon layer at a carbon concentration of $3.5 \times 10^{17}/cm^3$ is also shown in FIG. 1.

Figure 2:
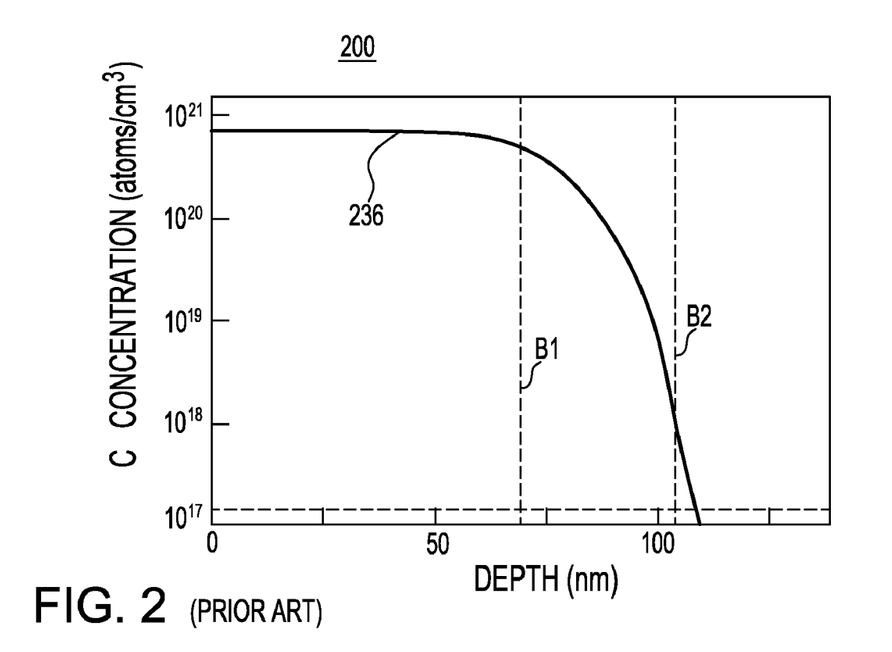
FIG. 2 shows a second graph 200 of a second depth profile 236 of carbon concentration of an Si:C layer according to the prior art.

FIG. 2 shows a second graph 200 of a second depth profile 236 of carbon concentration in an Si:C layer without a retrograde profile that the research leading to the present invention utilized. Si:C layers with the second depth profile 236 were manufactured on an SOI substrate during this research. A third depth B1 below which the carbon concentration decreases exponentially was chosen such that the third depth is greater than the thickness of the silicon layer above the buried oxide layer. In other words, the carbon concentration in the silicon layer was essentially flat. The dose of the carbon implantation was chosen such that the carbon concentration would be about $1.0 \times 10^{20}/cm^3$ or about 0.2% in atomic concentration throughout the top silicon layer. The flatness of the second depth profile 200 of carbon concentration in this Si:C layer was intentionally achieved in an effort to put in maximum amount of carbon into the silicon layer. The energy of the preamorphization implant was chosen such that the end-of-range of the amorphization implant fell within the buried oxide layer to avoid the generation of end-of-range defects in the Si:C layer after solid phase epitaxy. Both the third depth B1 and the fourth depth B2 at which the carbon concentration reaches $3.5 \times 10^{17}/cm^3$ are below the interface between the top silicon layer and the buried oxide layer.

Figure 3:
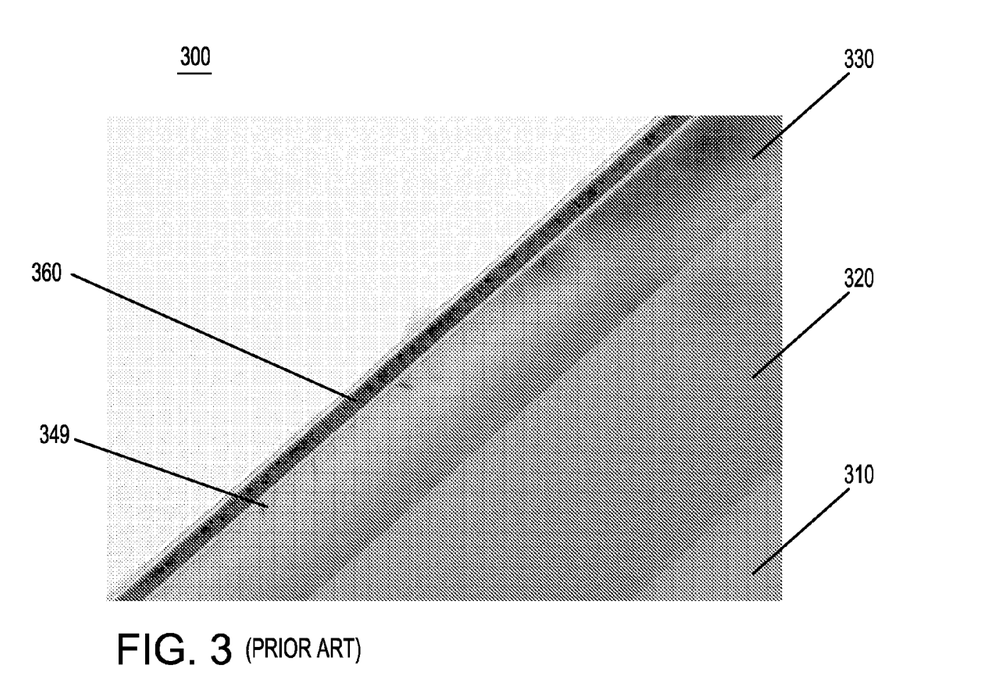
FIG. 3 shows a first transmission electron micrograph (TEM) 300 of a Si:C layer without an active retrograde profile according to the prior art.

A first transmission electron micrograph (TEM) 300 of the Si:C layer after solid phase epitaxy is shown in FIG. 3. The TEM 300 shows an underlying silicon substrate 310 under a buried oxide (BOX) 320, a carbon-substituted single crystal silicon (Si:C) layer 330, crystalline defects 349, and a chromium layer 360 that was used to cover the Si:C layer. The energy of the preamorphization implant was set such that the end-of-range of the preamorphization implant was within the buried oxide layer 320, which avoids end-of-range defects. The thickness of the carbon-substituted single crystal silicon layer 330 is about 70 nm. Ion implantation energy settings of 2 keV, 6 keV and 8 keV were used to deliver a total dose of about $4.0 \times 10^{15}/cm^2$ into the substrate. This combination of carbon implants produces the depth profile 236 of the carbon concentration shown in FIG. 2. The bulk carbon concentration after such implants is about $5.0 \times 10^{20}/cm^3$. The surface carbon concentration is almost identical to the bulk carbon concentration of $5.0 \times 10^{20}/cm^3$. While there is no end-of-range defect, as anticipated due to the selection of the energy of the preamorphization implant, the presence of a high density of defects 349 is clearly visible in the TEM 300. The types of defects include dislocations, stacking faults, and microtwins. Further experiments confirmed that the density of defects increases with increasing carbon concentration in the Si:C layer according to this approach.

Figure 4:
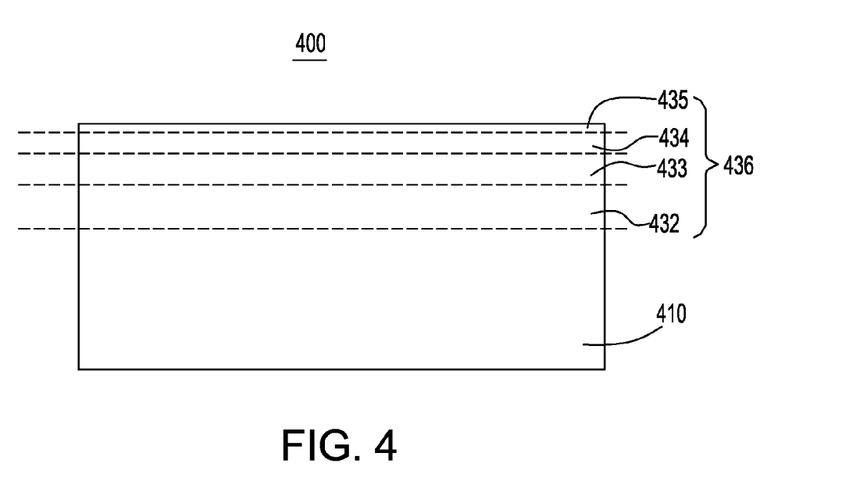
FIG. 4 shows a schematic cross-section of a bulk substrate with boundaries between various parts of the carbon implanted silicon layer 436 according to the present invention.

According to the first embodiment of the present invention, a silicon substrate is provided in which carbon atoms are implanted by ion implantation. The silicon substrate may be a bulk substrate or a silicon-on-insulator substrate. FIG. 4 shows a bulk silicon substrate 400 with a carbon implanted silicon layer 436 and an underlying silicon layer 410 in which virtually no carbon is implanted. The boundary between the carbon implanted silicon layer 436 and the underlying silicon layer 410 is determined by the depth at which the carbon concentration is $3.5 \times 10^{17}/cm^3$, or the solubility of carbon at the melting temperature of silicon. The thickness of the carbon implanted silicon layer 436 is the depth of the boundary between the carbon implanted silicon layer 436 and the underlying silicon layer 410.

In the case of a bulk silicon wafer, the carbon implanted silicon layer 436 is divided into four volumes of which the boundaries are represented by the four dotted lines in FIG. 4. The topmost dotted line, or the 2% line, in FIG. 4 corresponds to a distance of 2% of the thickness of the carbon implanted silicon layer 436 from the top surface of the silicon substrate. The second dotted line from the top, or the 30% line, in FIG. 4 corresponds to a distance of 30% of the thickness of the carbon implanted silicon layer 436 from the top surface of the silicon substrate. The third dotted line from the top, or the 60% line, in FIG. 4 corresponds to a distance of 60% of the thickness of the carbon implanted silicon layer 436 from the top surface of the silicon substrate. The bottommost dotted line, or the boundary line, in FIG. 4 corresponds to the thickness of the carbon implanted silicon layer 436 from the top surface of the silicon substrate. The first volume 435 is defined as the volume of the carbon implanted silicon layer 436 between silicon surface and the 2% line. The second volume 433 is defined as the volume of the carbon implanted silicon layer 436 between the 30% line and the 60% line. The third volume 434 is defined as the volume of the carbon implanted silicon layer 436 between the 2% line and the 30% line. The fourth volume 432 is defined as the volume of the carbon implanted silicon layer 436 between the 60% line and the boundary line.

Figure 5:
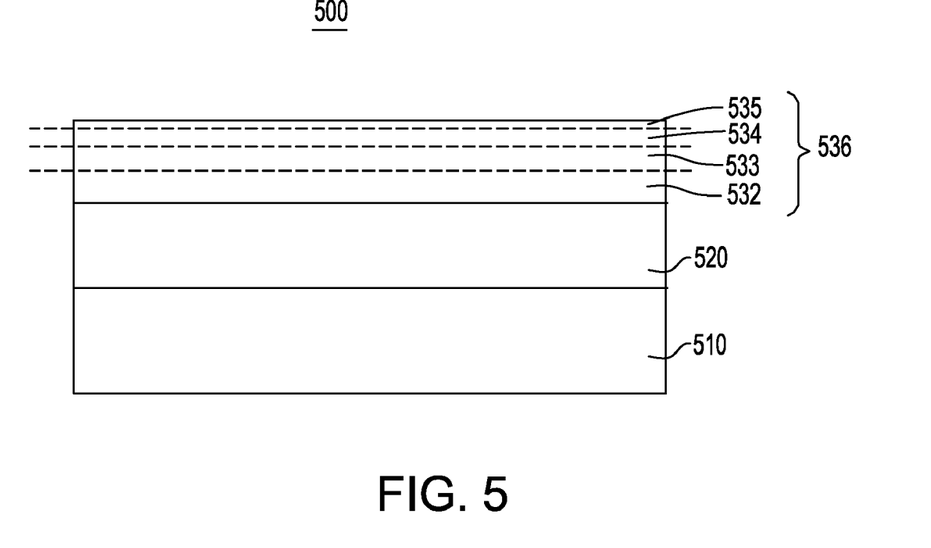
FIG. 5 shows a schematic cross-section of an SOI substrate with boundaries between various parts of the carbon implanted silicon layer 536 according to the present invention.

FIG. 5 shows an SOI silicon substrate 500 with an overlying silicon layer 536, a buried oxide layer 520, and an underlying silicon layer 510. According to the first embodiment of the present invention, the carbon implantation may be confined only within the overlying silicon layer 536 or it may extend into the buried oxide layer. If the carbon implantation is confined only within the overlying silicon layer, the depth at which the carbon concentration becomes $3.5 \times 10^{17}/cm^3$ is the thickness of the carbon implanted silicon layer. A first through fourth volumes are defined in a similar manner as in a bulk silicon wafer based on the thickness of the carbon implanted silicon layer.

If the carbon implantation extends into the buried oxide layer 520, the overlying silicon layer 536 is divided into four volumes with a definition of the thickness of the carbon implanted silicon layer as the thickness of the overlying silicon layer 536 as shown in FIG. 5. In other words, if the carbon implantation goes into the buried oxide layer 520 and as a result, the carbon concentration is above $3.5 \times 10^{17}/cm^3$ at all depths within the overlying silicon layer 536, the carbon implanted silicon layer is exactly the same as the overlying silicon layer 536. The topmost dotted line, or the 2% line, in FIG. 5 corresponds to a distance of 2% of the thickness of the overlying silicon layer 536 from the surface of the silicon substrate. The second dotted line from the top, or the 30% line, in FIG. 5 corresponds to a distance of 30% of the thickness of the overlying silicon layer 536 from the surface of the silicon substrate. The third dotted line from the top, or the 60% line, in FIG. 5 corresponds to a distance of 60% of the thickness of the overlying silicon layer 536 from the surface of the silicon substrate. The first volume 535 is defined as the volume of the carbon implanted silicon layer 536 between silicon surface and the 2% line. The second volume 533 is defined as the volume of the carbon implanted silicon layer 536 between the 30% line and the 60% line. The third volume 534 is defined as the volume of the carbon implanted silicon layer 536 between the 2% line and the 30% line. The fourth volume 532 is defined as the volume of the overlying silicon layer 536 between the 60% line and the boundary line.

Figure 6:
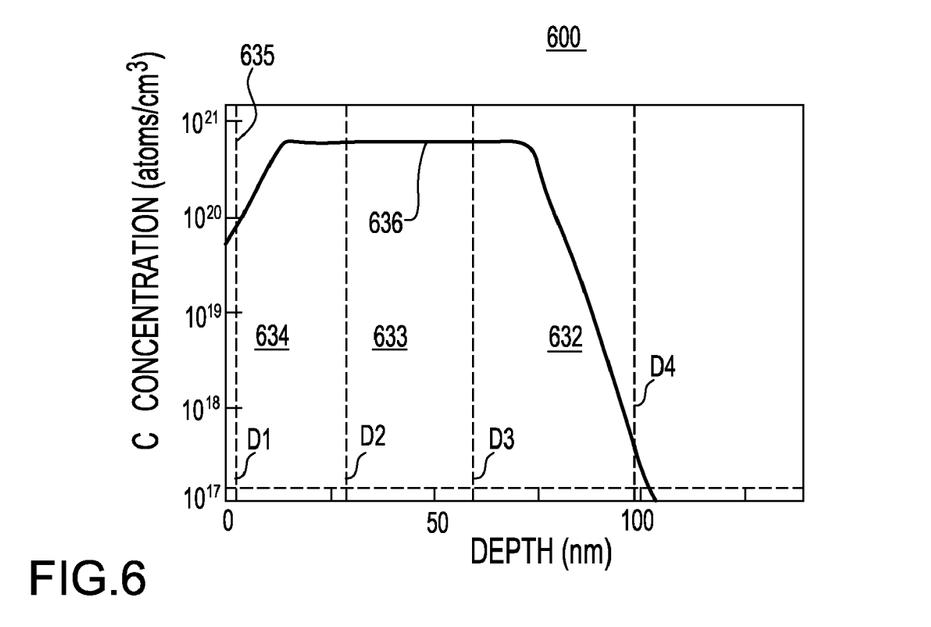
FIG. 6 shows a third graph 600 of a third depth profile 635 of carbon concentration of a Si:C layer with an active retrograde profile according to the present invention.

According to the present invention, a third depth profile 636 of carbon concentration is shown in graph 600 in FIG. 6. The third depth profile 636 applies not only to the first embodiment of the present invention but also to the second embodiment as well. The third depth profile 636 is divided into multiple parts at distances determined by fractions of the thickness of the carbon implanted silicon layer. The first depth D1 is the depth corresponding to 2% of the thickness of the carbon implanted silicon layer. The second depth D2 is the depth corresponding to 30% of the thickness of the carbon implanted silicon layer. The third depth D3 is the depth corresponding to 60% of the thickness of the carbon implanted silicon layer. The fourth depth D4 is the depth corresponding to the thickness of the carbon implanted silicon layer.

In bulk silicon wafers, the carbon concentration is $3.5 \times 10^{17}/cm^3$ at the fourth depth D4. In SOI wafers, the fourth depth may correspond to a depth at which the carbon concentration is $3.5 \times 10^{17}/cm^3$ and is less than the thickness of the overlying silicon layer or alternatively, the fourth depth may be the same as the thickness of the overlying silicon layer and the carbon concentration is above $3.5 \times 10^{17}/cm^3$ throughout the overlying silicon layer. Accordingly, the third depth profile 636 is divided into multiple portions including a first portion 635 corresponding to the first volume defined above, a second portion 633 corresponding to the second volume defined above, a third portion 634 corresponding to the third volume defined above, and a fourth portion 632 corresponding to the fourth volume defined above.

According to the first embodiment of the present invention, the average carbon concentration in the first portion 635 of the depth profile 636 is equal to or less than 25% of the average carbon concentration in the second portion 633 of the depth profile 636. Preferably, the average carbon concentration in the first portion 635 of the depth profile 636 is equal to or less than 15% of the concentration average carbon concentration in the second portion 633 of the depth profile 636 if the average carbon concentration of the second portion 632 of the depth profile 636 exceeds 2% in atomic concentration. Most preferably, the average carbon concentration in the first portion 635 of the depth profile 636 is equal to or less than about $1.0 \times 10^{20}/cm^3$ or about 0.2% in atomic concentration. The limitations and preferences in this paragraph apply to the second embodiment of the present invention to be presented below as well.

According to the first embodiment of the present invention, the carbon concentration of the second portion 632 of the depth profile 636 is equal to or less than 5.0% in atomic concentration. Preferably, the average carbon concentration of the second portion 632 of the depth profile 636 is equal to or greater than 0.2% and equal to or less than 5% in atomic concentration. More preferably, the average carbon concentration of the second portion 632 of the depth profile 636 is equal to or greater than 0.5% and equal to or less than 4% in atomic concentration. Most preferably, the average carbon concentration of the second portion 632 of the depth profile 636 is equal to or greater than 0.8% and equal to or less than 3% in atomic concentration. It is also preferable to have a flat carbon profile within the second portion 632 of the depth profile 636. The limitations and preferences in this paragraph apply to the second embodiment of the present invention to be presented below as well.

According to the first embodiment of the present invention, the second portion 632 of the depth profile 636 contains a substantially flat portion in the carbon concentration profile 600. In other words, the second portion 632 contains a plateau in the carbon concentration profile 600. The presence of the plateau reflects an attempt to maximize the overall carbon incorporation in the carbon implanted silicon layer 436 or in the overlying silicon layer 536. The range of the carbon concentration in the second portion 632 of the depth profile is preferably with the range of 50% and 150%, more preferably, within the range of 75% ad 125%, and most preferably within the range of 87.5% and 112.5% of the average carbon concentration of the second portion 632.

In an implementation of the present invention on an SOI substrate, the carbon implantation may be confined only within the overlying silicon layer 536 or it may extend into the buried oxide layer 520. In the case wherein the carbon implantation extends into the buried oxide layer, the average concentration of carbon in a fourth volume between 60% and 100% of the total thickness away from the surface of the semiconductor substrate is preferably within the range between 50% and 150%, more preferably, within the range of 75% ad 125%, and most preferably within the range of 87.5% and 112.5% of the average carbon concentration of the second portion 632.

According to the first embodiment of the present invention, it is also preferable to have a monotonically changing carbon concentration in the third portion 634 of the depth profile 636. Since the average carbon concentration in the second portion 636 of the depth profile 636 is higher than the average carbon concentration in the first portion 635, the concentration of carbon monotonically decreases from the depth at 30% of the thickness of the carbon-substituted single silicon layer to the depth at 2% of the thickness of the carbon-substituted single silicon layer. The preference in this paragraph applies to the second embodiment of the present invention to be presented below as well.

The carbon implanted silicon layer is then subjected to an anneal to facilitate a solid phase epitaxy process within the layer. Various methods of solid phase epitaxy may be employed for the purposes of the first embodiment of the present invention. These include a conventional anneal in a furnace, a rapid thermal anneal, a flash anneal, and a laser anneal. While the mechanism of anneal is thermally dominated, selection of a particular anneal method typically places limits on the temperature range for the anneal method. Typical temperature ranges for the anneal processes are: from about 650° C. to about 1000° C. for solid phase epitaxy through an anneal in a furnace; from about 650° C. to about 1200° C. for solid phase epitaxy through a rapid thermal anneal; and from about 700° C. to about 1428° C. for solid phase epitaxy through a laser anneal. As the thickness of the carbon implanted silicon layer increases, so does the anneal time. Since the mechanism of the process of solid phase epitaxy is primarily temperature dependent, the anneal time is mostly determined by the temperature for a given thickness of the layer and a given carbon concentration profile. Typically, the anneal time is in the range of 1 hour near the low temperature limit and approaches several seconds or even milliseconds near the upper temperature limit. Through the process of solid phase epitaxy, the carbon implanted silicon layer is regrown into a carbon substituted single crystal silicon. The depth profile of the carbon concentration does not change appreciably through the process.

The defect density of a carbon-substituted single crystal silicon with a certain level of surface carbon concentration according to the first embodiment of the present invention is comparable to the defect density of a prior art carbon-substituted single crystal silicon with a comparable bulk carbon concentration. The prior art produces carbon-substituted single crystal silicon layers with a low defect density of less than about $1.0 \times 10^9/\text{cm}^2$ only when the carbon concentration is less than or about $1.0 \times 10^{20}/\text{cm}^3$. As a consequence, the maximum bulk carbon concentration possible for a prior art carbon-substituted single crystal silicon is about $2.0 \times 10^{20}/\text{cm}^3$, or 0.4% in atomic concentration. While similar limits apply to the surface concentration of a carbon-substituted single crystal silicon layer according to the first embodiment of the present invention, the bulk concentration is not subjected to this limit. In fact, the bulk concentration is at least four times higher than the surface concentration. Therefore, the carbon-substituted single crystal silicon according to the first embodiment of the present invention enables a low defect density of less than about $1.0 \times 10^9/\text{cm}^2$ and carbon concentration greater than about $2.0 \times 10^{20}/\text{cm}^3$ for the bulk carbon concentration whereas the prior art enables only either a low defect density of less than about $1.0 \times 10^9/\text{cm}^2$ or carbon concentration greater than about $2.0 \times 10^{20}/\text{cm}^3$ for the bulk carbon concentration but not a combination of both in a carbon substituted single crystal silicon. The limitations and preferences in this paragraph apply to the second embodiment of the present invention to be presented below as well.

FIG. 7 shows a TEM 700 of a carbon-substituted single crystal silicon layer 730 formed on an SOI silicon substrate according to the first embodiment of the present invention. An underlying silicon layer 710, a buried oxide layer 720, and a chromium layer 760 deposited on the carbon-substituted single crystal silicon layer 730 are also shown. The energy of the preamorphization implant was set such that the end-of-range of the preamorphization implant was within the buried oxide layer 720, which avoids end-of-range defects. The thickness of the carbon-substituted single crystal silicon layer 730 is about 70 nm. Ion implantation energy settings of 6 keV and 8 keV were used to deliver a total dose of about $3.5 \times 10^{15}/\text{cm}^2$ into the substrate. The bulk carbon concentration after such implants is about $5.0 \times 10^{20}/\text{cm}^3$. The surface carbon concentration is less than about $1.0 \times 10^{20}/\text{cm}^3$. The low surface concentration was achieved by intentionally eliminating the 2 keV carbon implantation to create a retrograde profile according to the present invention. The defect density is less than about $1.0 \times 10^9/\text{cm}^2$ since there is no defect in the TEM 700 that spans over 0.4 microns of length of the TEM sample. The TEM 700 according to the first embodiment of the present invention contrasts with the TEM 300 according to the prior art in that while the samples for both TEMs have the same level of bulk carbon concentration as well as same dimensions of various layers in the SOI substrate, the TEM 300 according to the prior art shows numerous crystalline defects near the surface of the carbon-substituted single crystal silicon layer 330 while the TEM 700 according to the first embodiment of the present invention shows no defect near the surface of the carbon-substituted single crystal silicon layer 730.

Figure 8:
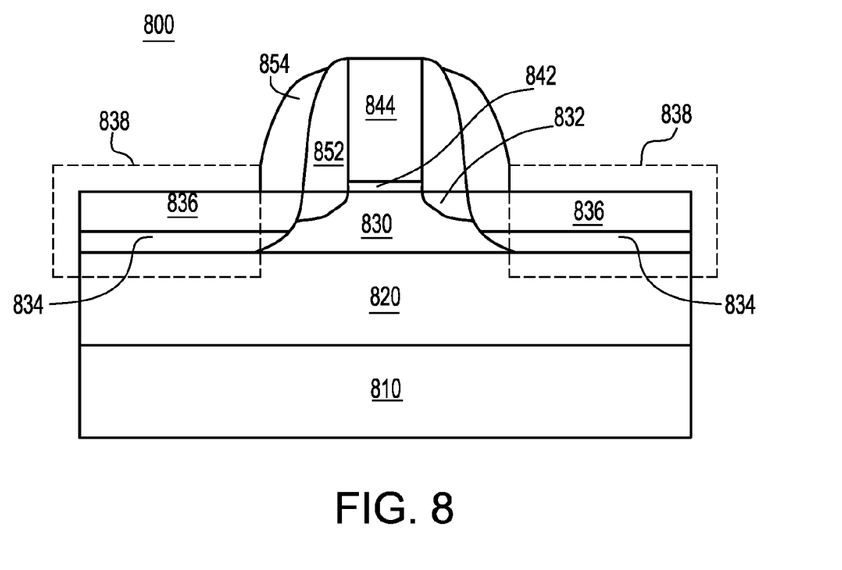
FIG. 8 shows a schematic cross-sectional view of a transistor according to the second embodiment of the present invention.

According to the second embodiment of the present invention, a transistor structure 800 incorporating an active retrograde profile in the carbon concentration in Si:C layers is shown in FIG. 8. The transistor structure 800 comprises an underlying silicon layer 810, a buried oxide layer 820, a body of the transistor 830, a gate dielectric 842, a gate conductor stack 844, FET extensions 832, first spacers 852, second spacers 854, embedded Si:C layers without source/drain electrical doping 834, and embedded Si:C layer with source/drain electrical doping 836. Each of the two carbon substituted single crystal silicon layers includes both one of the embedded Si:C layers without source/drain electrical doping 834 and one of the embedded Si:C layers with source/drain electrical doping 836. While it is in principle possible to incorporate an Si:C layer only within the source or only within the drain, preferably both the source and drain incorporate an Si:C layer respectively.

Within the transistor structure 800, the thickness and all other parameters for the vertical dimensions of the Si:C layers are measured within the carbon implanted area 838, or the part of the carbon implanted silicon layer within which carbon atoms were implanted through. In other words, the portion of the carbon implanted silicon layer in the periphery that is formed only through the lateral straggle, or "projected straggle" of the implanted carbon atoms is not used for the sake of quantifying any vertical dimension parameters for the obvious reason that the vertical profile of the carbon concentration changes depending on the distance away from the edge of the area directly exposed to the carbon implant.

According to the second embodiment of the present invention, the depth profile 636 in the graph 600 in FIG. 6 applies within the carbon implanted area 838. All the limitations and preferences on the carbon concentration with specific reference to the second embodiment of the present invention apply to the second embodiment of the present invention. The essential difference between the first embodiment and the second embodiment of the present invention is that the Si:C layer is fabricated in a continuous film according to the first embodiment whereas the Si:C layer is fabricated as an embedded film within the source and/or drain of a transistor according to the second embodiment.

After the implantation of carbon into the source and drain regions of a transistor, the transistor structure 800 is annealed to facilitate a solid phase epitaxy of the embedded carbon implanted silicon layers. Identical anneal processes for solid phase epitaxy may be employed as in the first embodiment of the present invention, i.e., a conventional anneal in a furnace, a rapid thermal anneal, and a laser anneal. The process conditions such as the anneal temperature and anneal time are optimized depending on the carbon concentration and thickness of the embedded Si:C layer.

The defect density in the source and drain of the transistor structure 800 according to the second embodiment of the present invention is much less than that of a similar transistor structure with comparable bulk carbon concentration in the source and drain according to the prior art. All the limitations and preferences on the defect density mentioned with specific reference to the second embodiment of the present invention apply to the second embodiment of the present invention.

One skilled in the art would immediately recognize that the depth of the electrical doping in the source and drain does not have to be less than the thickness of the carbon implanted silicon layer as depicted in FIG. 8. If the depth of the electrical doping is the same as the thickness of the carbon implanted silicon layer, as may happen on an SOI substrate wherein both implants reach into the buried oxide layer, the embedded Si:C layers without source/drain electrical doping 834 in FIG. 8 disappear from the structure. Furthermore, in some cases wherein the depth of electrical doping exceeds the thickness of the carbon implanted silicon layer, a portion of the source or drain may not have carbon doping and the Si:C layers may occupy only portions of the source and the drain. The present invention encompasses these obvious variations.

The critical feature of the present invention is the reduction of surface carbon concentration compared to the bulk carbon concentration. None of the prior art suggests any reduction of the carbon concentration near the surface of the carbon implanted silicon layer. Furthermore, reduction of carbon concentration near the surface of silicon below the 25% level of the average carbon concentration in the bulk is contrary to the general objective of increasing the carbon concentration in the Si:C layer. On the contrary, increase of stress in adjoining silicon structure requires maximizing total content of carbon and suggests incorporating as much carbon as possible into all parts of the Si:C layer. Also, theory on defects that was available prior to the present invention predicted no role of the surface in the generation of defects.

The present invention makes a combination of high bulk carbon concentration and relatively low surface carbon concentration to enable an incorporation of overall higher total amount of carbon in a carbon-substituted single crystal silicon layer and low defect density. While an Si:C layer with a bulk carbon concentration above $2.0 \times 10^{20}/cm^3$ according to the prior art cannot avoid a defect density higher than $1.0 \times 10^9/cm^2$, an Si:C layer according to the present invention with the same total amount of incorporated carbon and with the same thickness may achieve a defect density lower than about $1.0 \times 10^9/cm^2$ provided that the bulk carbon concentration is not excessively high, e.g., above 5%. By retrograding the depth profile of the carbon concentration between 30% and 2% of the thickness of the carbon implanted silicon layer during the carbon implantation, a carbon-substituted single crystal silicon layer with both high carbon concentration and low defect density is obtained according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a carbon-substituted single crystal silicon layer having a thickness and a defect density less than about $1.0 \times 10^9/cm^2$ located beneath a surface of a semiconductor substrate, wherein said carbon-substituted single crystal silicon layer includes a first volume, a second volume, a third volume, and a fourth volume, wherein said first volume is located within said single crystal silicon layer between said surface of said semiconductor substrate and a 2% line corresponding to a distance of 2% of said thickness away from said surface;

said third volume is located within said single crystal silicon layer between said 2% line and a 30% line corresponding to a distance of 30% of said thickness away from said surface; and said second volume is located within said single crystal silicon layer between said 30% line and a 60% line corresponding to a distance of 60% of said thickness away from said surface;

said fourth volume is located within said single crystal silicon layer between said 60% line and a bottom surface of said carbon-substituted single crystal silicon layer; and wherein the average concentration of carbon in said first volume is equal to or less than 25% of the average concentration of carbon in said second volume, said average concentration of carbon in said second volume is equal to or greater than 0.8% in atomic concentration, and the concentration of carbon monotonically decreases from the depth at 30% of said thickness of said carbon-substituted single silicon layer to the depth at 2% of said thickness of said carbon-substituted single silicon layer.

2. The semiconductor structure of claim 1, wherein said average concentration of carbon in said second volume is equal to or less than 5% in atomic concentration.

3. The semiconductor structure of claim 2, wherein said average concentration of carbon in said second volume is equal to or than 4% in atomic concentration.

4. The semiconductor structure of claim 3, wherein said average concentration of carbon in said second volume is equal to or less than 3% in atomic concentration.

5. The semiconductor structure of claim 1, wherein said average concentration of carbon in said first volume of is equal to or less than about $1.0 \times 10^{20}/cm^3$.

6. The semiconductor structure of claim 1, wherein said average concentration of carbon in said first volume of is equal to or less than about $1.0 \times 10^{20}/cm^3$.

7. A semiconductor device comprising at least one transistor with a source and a drain on a semiconductor substrate, each of said source and said drain containing a portion of a carbon-substituted single crystal silicon layer that is located beneath a surface of a semiconductor substrate and has a thickness and a defect density less than about $1.0 \times 10^9/cm^2$, wherein said carbon-substituted single crystal silicon layer includes a first volume, a second volume, a third volume, and a fourth volume, wherein said first volume is located within said single crystal silicon layer between said surface of said semiconductor substrate and a 2% line corresponding to a distance of 2% of said thickness away from said surface;

said third volume is located within said single crystal silicon layer between said 2% line and a 30% line corresponding to a distance of 30% of said thickness away from said surface;

said second volume is located within said single crystal silicon layer between said 30% line and a 60% line corresponding to a distance of 60% of said thickness away from said surface;

said fourth volume is located within said single crystal silicon layer between said 60% line and a bottom surface of said carbon-substituted single crystal silicon layer; and wherein the average concentration of carbon in said first volume is equal to or less than 25% of the average concentration of carbon in said second volume, said average concentration of carbon in said second volume is equal to or greater than 0.8% in atomic concentration, and the concentration of carbon monotonically decreases from the depth at 30% of said thickness of said carbon-substituted single silicon layer to the depth at 2% of said thickness of said carbon-substituted single silicon layer.

8. The semiconductor structure of claim 7, wherein said average concentration of carbon in said second volume is equal to or less than 5% in atomic concentration.

9. The semiconductor structure of claim 8, wherein said average concentration of carbon in said second volume is equal to or than 4% in atomic concentration.

10. The semiconductor structure of claim 9, wherein said average concentration of carbon in said second volume is equal to or less than 3% in atomic concentration.

11. The semiconductor structure of claim 7, wherein said semiconductor substrate is a silicon on insulator (SOI) substrate and said carbon-substituted single silicon layer contacts a buried oxide layer at a bottom surface of said carbon-substituted single crystal silicon layer.

12. The semiconductor structure of claim 11, wherein the average concentration of carbon in said third volume is within the range between 50% and 150% of said average concentration of carbon in said second volume.

13. The semiconductor structure of claim 7, wherein said semiconductor substrate is a bulk substrate.

14. The semiconductor structure of claim 7, wherein said average concentration of carbon in said first volume of is equal to or less than about $1.0 \times 10^{20}/cm^3$.

15. The semiconductor structure of claim 12, wherein said thickness of carbon-substituted single silicon layer is within the range of 10 nm and 300 nm.

16. The semiconductor structure of claim 15, wherein said thickness of carbon-substituted single silicon layer is within the range of 30 nm and 100 nm.

* * * * *